Oct. 7, 1958

HUNG C. LIN 2,855,568

SEMI-CONDUCTOR OSCILLATION GENERATORS

Filed Aug. 31, 1953

INVENTOR.
Hung C. Lin

BY H. W. Muston

ATTORNEY

United States Patent Office 2,855,568

Patented Oct. 7, 1958

2,855,568

SEMI-CONDUCTOR OSCILLATION GENERATORS

Hung C. Lin, Levittown, Pa., assignor to Radio Corporation of America, a corporation of Delaware Application August 31, 1953, Serial No. 377,505

10 Claims. (Cl. 332—37)

This invention relates in general to electrical oscillation generators and in particular to oscillation generators in which semi-conductor devices are utilized as the amplifier element.

Semi-conductor oscillator circuits employing transistors of both the point-contact and junction type have been developed and are presently well-known in the art. These circuits may be connected to operate in any of a number of ways depending primarily on the particular application for which the circuit was designed. Thus, oscillator circuits have been developed using an external feedback path between the input and output circuits of the transistor. If the energy which is fed back is of proper phase and amplitude, as is well known and understood, the normal circuit losses may be compensated for and sustained oscillation will be accomplished. In other oscillator circuits utilizing transistors, an external feedback path has been found to be unnecessary; sustained oscillation being accomplished by virtue of the particular electrical characteristics of the transistor used.

Many transistor oscillator circuits have been characterized to some extent by frequency instability. It has been found, for example, that the fundamental operating frequency of a transistor oscillator may vary with time for a single setting of the circuit components. These variations in the fundamental frequency may be the result of variations in the source of operating bias potential. For most circuit applications, frequency instability of the oscillator is undesirable.

It is also well known that the amplitude of an oscillatory wave developed by an oscillator circuit utilizing a semi-conductor device or transistor may be readily changed by impressing an alternating current modulation signal on either the base, the emitter, or the collector of the transistor. It has been found, however, that the application of an alternating current voltage to any of the electrodes of a transistor will also cause the reactance appearing across the output circuit of the transistor to change. This aspect of transistors has been described in the United States Patent 2,570,938 issued to Hunter C. Goodrich, Jr. for "Variable Reactance Transistor Circuit" on October 9, 1951, and Patent 2,544,211 issued to Loy E. Barton for "Variable Impedance Device" on March 6, 1951. This change of the output reactance will also cause the frequency of oscillation to change. Thus, in a conventional amplitude modulation system, the amplitude modulated output signal of the oscillator will also be accompanied by undesired frequency modulation.

It is, accordingly, an object of the present invention to provide a semi-conductor oscillator circuit capable of generating an oscillatory wave of substantially constant frequency.

It is another object of the present invention to provide a semi-conductor oscillation generator capable of producing an amplitude modulated carrier wave of substantially constant frequency.

It is a further object of the present invention to provide a semi-conductor modulated oscillator circuit wherein the modulation characteristic is linear over a broad range of applied modulating voltage.

It is yet another object of the present invention to provide a transistor oscillator circuit wherein linear and broad band amplitude modulated carrier wave energy is produced having a substantially constant frequency.

An oscillator circuit in accordance with the present invention may include a semi-conductor device such as a transistor, having a semi-conductive body and a base, an emitter, and a collector in contact therewith. The transistor may be arranged generally in a conventional oscillator circuit and may have a modulating or control voltage or signal applied to the collector electrode. A predetermined portion of the direct current biasing potential or modulating voltage is selected by means of a voltage divider or other appropriate circuitry, and applied to the base for achieving frequency stability.

The various aspects of the present invention apply equally well to either the junction type of transistor or the point-contact type of transistor and accordingly, the following discussion is to be taken as applying equally well to either type of transistor unless it is specifically pointed out that only one of the types can be utilized in the specific circuit under discussion.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
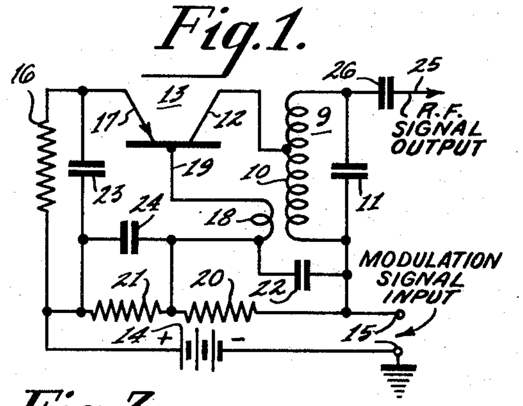
Figures 1 and 2 are schematic circuit diagrams of amplitude modulated transistor oscillator circuits utilizing junction transistors in accordance with the present invention.

Referring now to the drawing, wherein like components have been designated by the same reference numerals throughout the various figures, and particularly to Figure 1, an inductor 10 and a capacitor 11 are arranged as a parallel resonant circuit 9 which is tuned to the center frequency or a carrier wave frequency of the energy to be generated and coupled to the collector electrode 12 of a junction transistor 13. A source of direct current operating bias may be provided, such as illustrated, by a battery 14 connected between one terminal 15 of a modulation signal input source and one terminal of an impedance element or resistor 16, the other terminal of which is connected to the emitter 17. A feedback inductor 18 is connected between the base 19 of transistor 13 and the junction of a pair of impedance elements shown in this embodiment of the invention as a voltage divider network comprising a pair of resistors 20 and 21. The inductor 18 is inductively coupled to the inductor 10 of the parallel resonant circuit 9. In order to provide a low impedance oscillator frequency signal path between the low potential ends of the inductors 10 and 18, a bypass capacitor 22 is connected directly therebetween. It is noted that the polarity of the battery 14 is such that the collector and base are biased in a relatively non-conducting direction and that the emitter and base are biased in a relatively conducting direction. It should also be noted that the battery 14 is shown as properly poled for P–N–P junction transistors. If N–P–N junction transistors were utilized, the polarity of the battery would have to be reversed.

By-pass capacitors 23 and 24 are also connected respectively between the emitter 17 and one terminal of resistor 21 and between the inductor 18 and the junction of capacitor 23 and resistor 21, and serve as low impedance paths for the oscillator frequency energy. The modulation input terminals 15 are connected to the two ends of the voltage divider resistors 20 and 21, to which may be connected any suitable source of modulation signal, such as a microphone, the output of a speech amplifier, or the like, as will hereinafter be shown. Modulated R–F signal output may be taken from the oscillator circuit from any suitable point, such as the higher voltage end of the tuned circuit 9 through coupling means such as output lead 25 and a coupling capacitor 26.

The oscillator portion of this circuit operates in the manner of a conventional junction transistor oscillator, that is, the parallel resonant tuned circuit 9 comprising the inductor 10 and the capacitor 11 determines the operating frequency of the oscillator. Energy is fed back from the inductor 10 by means of the mutual coupling between it and the feedback inductor 8 to the base electrode 19 of the transistor. This feedback energy is provided in phase and magnitude, through the coupling shown, to overcome the losses in the circuit and thereby sustain continuous oscillation of the circuit.

Amplitude modulation of this generated energy is produced by varying the modulating voltage which is applied to the collector 12 from the modulation input terminals 15. It has been found, however, as above mentioned, that when the modulating voltage is applied only to the collector electrode, there is usually produced an undesired frequency variation or modulation in addition to the desired amplitude modulation.

In accordance with the present invention, a portion of the modulating voltage as determined by the relative magnitude of the voltage divider resistors 20 and 21, is applied to the base 19. It has been found that when a predetermined portion of the modulating voltage which is applied to the collector 12 is thus applied to the base 19 as above described, the heretofore encountered undesirable frequency variation does not occur and that linear amplitude modulation without frequency variation can be produced. The ratio of the voltage dividing resistors 20 and 21 is adjusted until this resultant operation is obtained.

Figure 2:
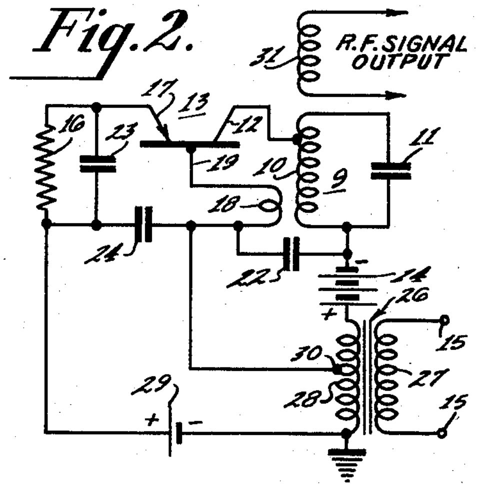

In Figure 2 a transistor oscillator which is substantially identical to the transistor oscillator above described in connection with Figure 1 has its modulating voltage applied by means of a modulation transformer 26, rather than the voltage divider resistor network as described in connection with Figure 1. The modulation transformer 26 comprises a primary winding 27, and a secondary winding 28 connected directly between a point of fixed reference potential or ground for the system and the positive terminal of the battery 14. A tap 30 on the secondary winding is connected through the feedback inductor 18 to the base 19 of transistor 13. To provide the proper emitter bias in this embodiment of the invention, an additional battery 29 is connected from ground through the emitter biasing resistor 16 to the emitter 17.

The operation of the transistor oscillator per se is conventional as mentioned in connection with Figure 1. However, in this embodiment of the invention, the percentage of modulating voltage selected to be applied to the base is determined by the characteristics of the modulation transformer 26. The transformation ratio of the modulation transformer and the polarity of the secondary connection is such that, as in the circuit of Figure 1, the modulation energy applied to the base of the oscillator circuit from the input terminals 15 is of magnitude and phase to provide a linear amplitude modulation of the transistor modulator circuit without frequency variation. Modulated signal output energy may be derived from the tuned circuit 9 by any suitable coupling means such as a pickup inductor 31 which is inductively coupled with the tuning inductor 10 as shown.

Figure 3:
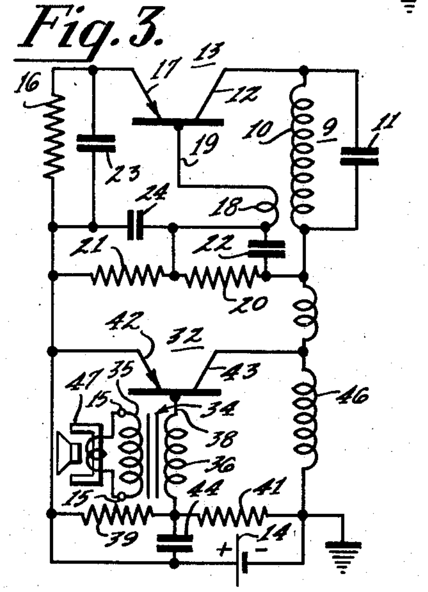
Figure 3 is a schematic circuit diagram of an amplitude modulation transmitter embodying the present invention.

Referring now to Figure 3, a transistor transmitter includes a pair of transistors 13 and 32, the transistor 13 being the amplifier element of the oscillator circuit which is identical with the oscillator circuit described in connection with Figure 1, the voltage dividing network comprising the resistors 20 and 21 preventing undesired frequency modulation. The transistor 32 serves as the speech amplifier or modulator that develops the voltage that is impressed on the collector and base of the transistor 13.

An input transformer 34 including a primary winding 35 and a secondary winding 36 has its secondary winding connected directly with the base 38 of transistor 32 and to the junction of a pair of resistors 39 and 41 which serve to provide the proper bias between the emitter 42 and the base 38 and the collector 43 and the base 38. A by-pass capacitor 44 is also connected from the junction of resistors 39 and 41 to the positive terminal of biasing battery 14 which is connected between ground and the emitter 42. An audio frequency choke coil 46 is connected between ground and the collector 43.

A dynamic microphone is connected to the terminals 15 and directly across the primary winding 35 to provide a miniature amplitude modulated transmitter which may be conveniently used in combination with a radio receiver as a wireless public address system. Modulated signals may be propogated directly from the inductor 10 of the oscillator tank circuit or through any other suitable coupling means.

As in Figure 1, amplitude modulation is accomplished by applying an alternating current modulating signal to the collector 12, although in this case the modulating signal is amplified by the transistor modulator 32 before it is applied. The relative proportion of the modulating voltage which is applied between the collector and emitter and the base and emitter of transistor 13 is determined by the relative resistances of resistors 20 and 21. When these resistors are properly proportioned, linear amplitude modulation will occur without having an undesired frequency modulation characteristic.

Figure 4:
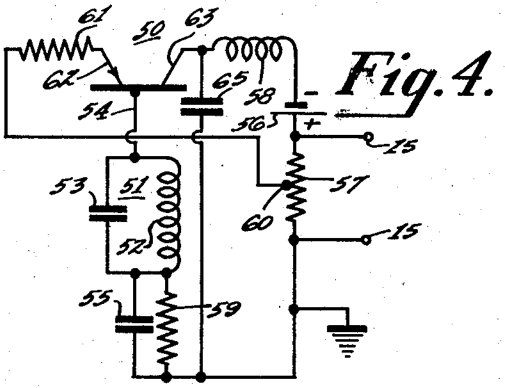
Figures 4 and 5 are schematic circuit diagrams of amplitude modulated transistor oscillator circuits utilizing point-contact transistors in accordance with the present invention.

While it will be understood that the circuit specifications may vary according to the design for any particular application, the following circuit specifications are included for the circuit of Figure 3 by way of example only:

Resistors 16, 20, 21, 39 and 41—4700; 33,000; 82,000; 1500; and 100,000 ohms, respectively
Capacitors 11, 22, 23 and 24—3300; 1500; 1500; and 1500 micromicrofarads, respectively
Battery 14—22.5 volts In Figure 4, a transistor oscillator utilizing a point-contact transistor 50 includes a parallel resonant circuit 51 comprising an inductor 52 and a capacitor 53. The parallel resonant circuit 51 determines the operating frequency of the transistor oscillator and is connected between the base 54 and the ungrounded end of a by-pass capacitor 55. A biasing resistor 59 is connected between the tuned circuit 51 and ground in parallel with capacitor 55.

Bias voltages for the transistor oscillator are provided by a battery 56 which is connected in series with a modulation impedance element which is shown as a tapped resistor 57 and the radio frequency choke 58 to the collector 59 of the point-contact transistor 50, and poled to bias the collector and base in a relatively non-conducting direction.

The resistor 57 serves as a voltage dividing network for the modulation signal input which is applied to the terminals 15. To this end a tap 60 is connected from a predetermined point on the resistor 57 through a biasing resistor 61 to the emitter 62. A by-pass capacitor 65 provides a low impedance path at the oscillator frequency and is connected from the junction of the collector 63 and the radio frequency choke coil 58 to ground in order to remove the effect of the oscillator energy from the battery 56 and from the modulation source which is connected to the modulation input terminals 15.

The oscillator portion of the circuit operates in the manner of a conventional point-contact type of transistor oscillator. There is no requirement of an external feedback as the feedback which is necessary to produce and sustain oscillation is provided by the negative resistance characteristic of the transistor itself. The normal or center frequency of oscillation is determined by the frequency of the parallel resonant circuit 51 which is connected in the base electrode circuit.

Amplitude modulation of the oscillator circuit is accomplished by applying a modulation voltage to the collector. The relative proportion of modulating voltage which is applied between the collector and emitter and between the base and emitter is determined by proper positioning of the tap 60 on the voltage dividing resistor 57. Upon proper proportioning of the resistance as determined by the tap position, the phase and magnitude of the modulating voltage which is applied between the two above mentioned pairs of electrodes is such that linear broad band amplitude modulation will occur without having undesirable frequency modulation.

Figure 5:
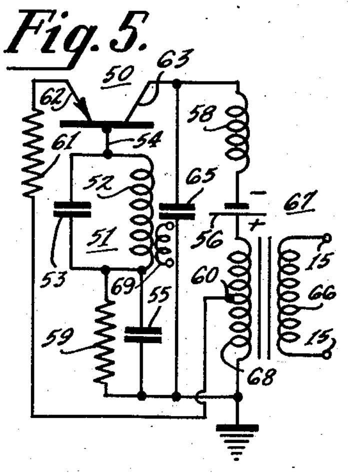

In Figure 5 the amount of the modulating voltage which is applied to the two respective circuits is determined by a modulation transformer 67 having a tapped secondary winding 68 and a primary winding 66. The modulating voltage is applied to the modulation input terminals 15 which are connected to the ends of the primary windings 66. A radio frequency choke coil 58 is connected between the collector 63 and the negative terminal of the bias battery 56, as in Figure 4. In this embodiment of the invention, the ratio of the number of turns between the two ends of the secondary winding 68 and the tap 60 are selected such that the proper proportion and phase of the modulating voltage is applied to the collector and base electrodes thereby establishing amplitude modulation without undesirable frequency modulation. Modulated output signals may be derived from the tuned circuit 51 by a pickup coil 69 as shown.

Figures 6, 7:
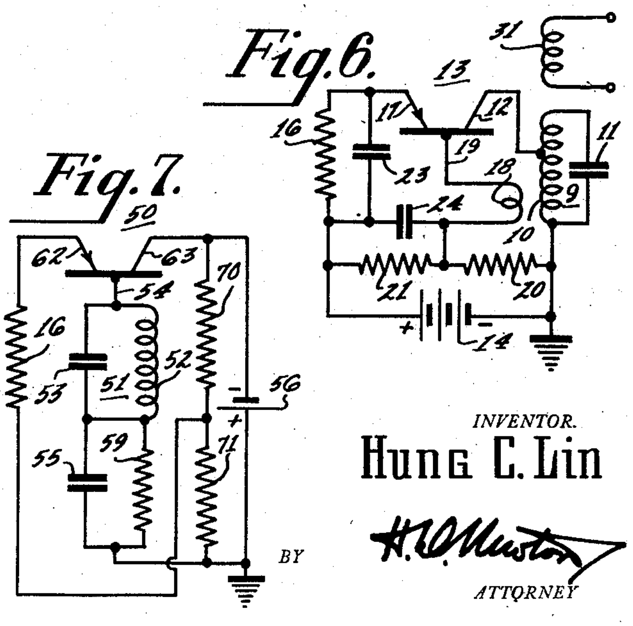
Figures 6 and 7 are schematic circuit diagrams of oscillator circuits utilizing junction and point-contact transistors, respectively, in accordance with the present invention.

In Figure 6, reference to which is now made, the principles of the present invention are utilized to stabilize the frequency of generated oscillatory waves in a junction transistor oscillator circuit of the type illustrated in Figure 1, but which does not include a source of modulating voltage. It has been found, in accordance with the present invention, that the voltage dividing action of the resistors 20 and 21 on the direct current biasing voltage supplied by the battery 14 will be effective to prevent frequency instability. Thus, the biasing voltage for transistor 13 will always be applied to the collector, emitter and base in the same proportion and the variations of the direct current operating bias source will be compensated for. In other words, the voltage dividing action has been found to be effective on either an alternating current modulating voltage or a direct current bias voltage. Output oscillatory signals may be taken from across the coupling inductor 31 which is coupled to the inductor 10 of the tank circuit 9.

In Figure 7, these same principles have been applied to a point-contact transistor oscillator circuit of the type illustrated in Figure 4. Here, a connection from the junction of a pair of resistors 70 and 71 and including the resistor 16 to the emitter 62 determines the proportion of direct current biasing voltage which is applied to the collector, emitter and base; the resistors 70 and 71 being equivalent to the tapped resistor 67 of Figure 4. As was explained in connection with Figure 6, the inclusion of a voltage dividing network such as the resistors 70 and 71 has been found to compensate for variations in the direct current source of operating bias and provide frequency stability for the oscillator circuit.

As described herein, frequency instability of semiconductor oscillator circuits is prevented or minimized by the provisions of the present invention. In addition, undesired frequency modulation is prevented or minimized in an amplitude modulated transistor circuit. Thus, an output signal which has a linear amplitude deviation and a substantially constant frequency characterizes the improved oscillator circuits of the invention.

What is claimed is:

1. An amplitude modulated semi-conductor oscillator circuit including a semi-conductor device having a collector electrode, an emitter electrode and a base electrode, circuit means connected with said electrodes for establishing oscillations in said circuit at a predetermined frequency, a voltage divider network connected in circuit with said collector and emitter electrodes for applying a modulating signal therebetween, and means including a portion of said voltage divider network connected in circuit with said base and emitter electrodes for applying a predetermined portion of said modulating signal between said base and emitter electrodes for providing constant-frequency linear amplitude modulation of said oscillator circuit.

2. An amplitude modulated semi-conductor oscillator circuit including a semi-conductor device having a collector electrode, an emitter electrode and a base electrode, means for biasing said collector and base electrodes in a relatively non-conducting polarity, circuit means connected with said electrodes for establishing oscillations in said circuit at a predetermined frequency, and further circuit means connected with said electrodes for applying a modulating signal between said collector and emitter electrodes to amplitude modulate said oscillator circuit, a portion of said further circuit means being connected for applying a predetermined portion of said modulating signal between said base and emitter electrodes to eliminate undesired frequency modulation of said oscillator circuit.

3. An amplitude modulated semi-conductor oscillator circuit including a semi-conductor device having a collector electrode, an emitter electrode and a base electrode, means for biasing said collector and base electrodes in a relatively non-conducting polarity and for biasing said emitter and base electrodes in a relatively conducting polarity, tunable circuit means connected with said device for oscillator operation at a predetermined frequency, amplitude modulation means connected in circuit with said collector and emitter electrodes for applying a modulating signal therebetween to amplitude modulate said oscillator circuit, and further modulation means connected in circuit with said base and emitter electrodes for applying a predetermined portion of said modulating signal between said base and emitter electrodes to eliminate frequency modulation of said oscillator circuit.

4. The combination as defined in claim 3, wherein said further modulation means comprises a voltage divider network including a pair of series resistors.

5. An amplitude modulated semi-conductor oscillator circuit including a semi-conductor device having collector, emitter and base electrodes in contact therewith, circuit means connected with said electrodes for establishing oscillations in said circuit at a predetermined frequency, means connected between the collector and emitter electrodes for applying an amplitude modulating signal to said collector electrode, and further means connected between the base and emitter electrodes for applying a predetermined portion of said amplitude modulating signal to said base electrode providing a broad band amplitude modulation signal output from said oscillator circuit substantially devoid of frequency modulation.

6. An amplitude modulated semi-conductor oscillator circuit including a semi-conductor device having a collector electrode, an emitter electrode and a base electrode in contact therewith, circuit means connected with said electrodes for establishing oscillations in said circuit at a predetermined frequency, means coupled between said collector and emitter electrodes for applying a modulating signal thereto, and further means coupled between said base and emitter electrodes for applying a predetermined portion of said modulating signal between said base and emitter electrodes providing linear constant-frequency amplitude modulation of said oscillator circuit.

7. An amplitude modulated oscillator circuit comprising in combination, a semi-conductor device having an emitter electrode, a collector electrode and a base electrode, energization means including a source of potential for biasing said collector and base electrodes in a relatively non-conducting polarity and for biasing said emitter and base electrodes in a relatively conducting polarity, feedback means for said oscillator including a frequency-determining parallel-resonant circuit coupled between said base and collector electrodes and an inductor connected with said base electrode, an impedance element connected in circuit with said collector and emitter electrodes, a pair of input terminals connected with said impedance element for impressing a modulating signal between said collector and emitter electrodes, and means connected between said base electrode and an intermediate point on said impedance element for applying a predetermined portion of soid modulating signal between said base and emitter electrodes to effect linear amplitude modulation substantially devoid of frequency modulation.

8. An amplitude modulated oscillator circuit in accordance with claim 7, wherein said impedance element comprises a pair of resistors in series arrangement.

9. An amplitude modulated oscillator circuit in accordance with claim 7, wherein said impedance element comprises a modulation transformer having a tapped secondary winding.

10. An amplitude modulated oscillator circuit comprising in combination, a semi-conductor device having an emitter electrode, a collector electrode, and a base electrode, means for biasing said collector and base electrodes in a relatively non-conducting polarity and for biasing said emitter and base electrodes in a relatively conducting polarity, a parallel resonant circuit connected with said collector electrode for determining the operating frequency of said oscillator circuit, a freedback inductor connected with said base electrode, a first impedance element connected between the low signal voltage end of said parallel resonant circuit and said inductor, a second impedance element connected between one terminal of said first impedance element and said emitter electrode, and a pair of input terminals connected with said impedance elements for impressing a modulating signal between said collector and emitter electrodes, said first impedance element and said second impedance element being proportioned to apply a predetermined portion of said modulating signal between said base and emitter electrodes effective to provide linear amplitude modulation with minimum frequency modulation.

References Cited in the file of this patent

UNITED STATES PATENTS

| | | |
|---|---|---|
| 2,486,776 | Barney | Nov. 1, 1949 |
| 2,556,286 | Meacham | June 12, 1951 |
| 2,629,858 | Koros | Feb. 24, 1953 |

OTHER REFERENCES

Review of Scientific Instruments for August 1949, pages 586, 587, 588.